United States Patent [19]
Warnier et al.

[11] Patent Number: 5,700,548
[45] Date of Patent: Dec. 23, 1997

[54] MULTILAYER FILM, MULTICOLOUR SCREEN-PRINTING PROCESS FOR THE MANUFACTURE OF SAID MULTILAYER FILM AND THE USE OF SAME

[75] Inventors: Jacques Warnier, Eysden; Gerrit Van Der Beek, Heerlen; Hubertus Weerts, Landgraaf, all of Netherlands

[73] Assignee: U.S. Philips Corporation, New York, N.Y.

[21] Appl. No.: 796,406

[22] Filed: Feb. 6, 1997

Related U.S. Application Data

[63] Continuation of Ser. No. 556,299, Oct. 23, 1995, abandoned, which is a continuation of Ser. No. 318,419, Oct. 5, 1994, abandoned.

[30] Foreign Application Priority Data

Oct. 6, 1993 [DE] Germany .......................... 43 34 059.8

[51] Int. Cl.⁶ ........................................................ B32B 3/00
[52] U.S. Cl. .................... 428/209; 428/210; 428/688; 428/701; 428/702; 428/901; 361/321.2; 361/748; 29/25.42
[58] Field of Search ............................... 428/209, 210, 428/701, 702, 688, 901; 361/321.2, 148; 29/25.42

[56] References Cited

U.S. PATENT DOCUMENTS

| | | | |
|---|---|---|---|
| 4,080,414 | 3/1978 | Anderson | 264/41 |
| 4,750,084 | 6/1988 | Nikaidoj | 361/321.2 |
| 5,209,873 | 5/1993 | Yamamoto | 428/688 |

FOREIGN PATENT DOCUMENTS

| | | |
|---|---|---|
| 0329484 | 8/1989 | European Pat. Off. . |
| 3105905 | 5/1991 | Japan . |

*Primary Examiner*—William Krynski
*Attorney, Agent, or Firm*—Norman N. Spain

[57] ABSTRACT

The invention relates to a multilayer film, in particular for the films for the manufacture of passive electronic components, the multilayer film having a small and uniform layer thickness, an improved layer structure and the method of manufacturing said films being simpler. In accordance with the invention, a multilayer film is proposed which comprises a green ceramic substrate film, inner electrodes provided by screen printing and one or more levelling layers which are provided on the whole area accommodating the green ceramic substrate film and the inner electrodes by means of screen printing. The inner electrodes and the levelling layer(s) are successively provided on the green ceramic substrate film by screen printing.

8 Claims, 3 Drawing Sheets

MULTILAYER FILM, MULTICOLOUR SCREEN-PRINTING PROCESS FOR THE MANUFACTURE OF SAID MULTILAYER FILM AND THE USE OF SAME

This is a continuation of application Ser. No. 08/566,299, filed Oct. 23, 1995, now abandoned, which is a continuation of application Ser. No. 08/319,418, filed Oct. 5, 1994, now abandoned.

BACKGROUND OF THE INVENTION

The invention relates to a multilayer film, in particular for passive electronic components having a multilayer structure.

The invention further relates to a multicolour screen-printing process for the manufacture of such multilayer films as well as to the use of said films.

In the electronics industry many passive components are manufactured in a multilayer structure. Said components include, for example, multilayer capacitors, multilayer actuators and multilayer varistors.

The components which are manufactured in the largest numbers are multilayer capacitors. A multilayer capacitor in accordance with the state of the art comprises a laminated stack of thin, ceramic, dielectric layers between which inner electrodes are arranged. The inner electrodes are interconnected by external contacts.

Multilayer actuators and multilayer varistors are constructed in a similar manner, i.e. "green" (unfired) ceramic substrate films on which metallic current paths are provided are sintered together to form a complex three-dimensional multilayer film.

Passive electronic components having a multilayer structure are generally produced by first manufacturing green ceramic substrate foils from, in general, dielectric ceramic components and binder preparations.

The inner electrodes are provided on the substrate films by coating the green ceramic with a metallizing paste in accordance with the electrode pattern. Said metallized green substrate films are stacked, and the stack is laminated to form a semi-finished plate. Said semi-finished plates are divided into the desired products. Subsequently, the binder is burned out and the ceramic material is sintered. Next, the outer electrodes are provided.

However, when metallized, green ceramic substrate films of the type described above are stacked, a semi-finished plate is obtained having metallized regions whose thickness substantially exceeds that of the non-metallized regions. This causes disturbing effects when the stack is compressed.

If the thickness of the substrate film is many times higher than the layer thickness of the electrodes, the above-mentioned effects which are based on the alternating film thicknesses are less noticeable. When the stack is compressed, the relatively thick substrate film is pressed into the space between the electrodes. The substrate foil fills up said interspaces and the vertical stacking order of the electrodes is essentially preserved when the stack is compressed.

The continuing miniaturization of passive components, however, leads to ever thinner substrate films whose thicknesses are comparable to those of the inner electrodes. Said thin films cannot completely fill up the spaces between the superimposed inner electrodes when the stack is compressed.

Such a stack structure inevitably leads to the occurrence of shear forces during the compression process, which forces cause the individual films to move relative to each other. Viewed in cross-section, the films are often arranged in an irregular sinuous pattern ("chevronning"). The inner electrodes are no longer accurately arranged one upon another. Owing thereto, it is more difficult to accurately position the pasting cut for dividing the plate into individual products.

On the other hand, when the metallized, green substrate films are compressed, bubbles may be formed between them as a result of the alternating layer thicknesses, which bubbles cannot be removed in the burning and sintering processes. This may lead to delamination in the manufacturing process or to premature breakdown of the product.

For this reason, various ways of improving the layered structure of passive electronic components having a multilayer structure have been proposed.

JP 3-105 905 discloses a method of manufacturing a homogeneous green film of uniform thickness, in which method a first paste for the continuous manufacture of inner electrodes is screen printed onto a wound substrate film.

Subsequently, for the manufacture of a dielectric film between the pattern of the inner electrodes, a second ceramic paste is provided, using the same printing process as for the inner electrodes, onto the part of the wound film where no inner electrodes were printed, whereafter an accurate positioning by means of stop holes in the film was carried out.

After screen printing of the second paste, a film of a ceramic slurry was formed on the printed surface by means of a "doctor blade" process.

Subsequently, the film was dried, cut into pieces, perforated and laminated. Next, the finished part was calcinated.

This method has the disadvantage that printing of the second ceramic paste between the inner electrodes requires a very accurate positioning of the screen. It can hardly be avoided that, in the case of inaccurately positioned screen stencils, narrow unprinted interspaces and undercuts remain between inner electrodes and dielectric connecting pieces printed therebetween, which interspaces and undercuts cannot even be filled up with material when a coating of a ceramic material is subsequently provided.

A phenomenon which is also undesirable but which is difficult to avoid is print overlap which leads to irregularities in the surface of the laminated film.

A further disadvantage resides in that a second, different coating process is used to complete the laminated film.

SUMMARY OF THE INVENTION

For this reason, it is an object of the invention to provide a multilayer film having a uniform film thickness and an improved structure, in particular for passive electronic components having a multilayer structure.

The invention further aims at providing a simple method of manufacturing such multilayer films.

A further aspect of the invention relates to the advantageous use of such multilayer films.

This object is achieved in accordance with an aspect of the invention by providing a multilayer film, in particular for passive electronic components having a multilayer structure, which multilayer film a) comprises a green ceramic substrate film which contains one or more ceramic components and a binder preparation, b) on which substrate film inner electrodes are provided by screen printing, which electrodes comprise one or more metallic components and, optionally, ceramic filling agents and a binder preparation, and c) one or more levelling layers comprising one or more ceramic components and a binder preparation being provided on the entire area accommodating inner electrodes and green ceramic substrate film by means of screen printing.

These screen printed levelling layers uniformly cover the entire surface of the substrate film on which the electrode pattern is printed. Said levelling layers also evenly fill up the interstices between the inner electrodes and constitute a thin cover layer for the inner electrodes. Therefore, this method is also referred to as "print over" method. The multilayer films in accordance with the invention have a uniform layer thickness throughout the printed surface. In addition, the inner electrodes are protected against mechanical damage and contamination of their surfaces.

Since ceramic pastes of a relatively high viscosity can be used in the screen-printing process, the shrinkage of the levelling layers is small, in particular between the inner electrodes.

The micro-roughness of layers provided by means of screen printing is characterized by a relatively substantial peak-to-valley ratio. Consequently, the levelling layers provided by screen printing bond very well when the stack is compressed.

The multilayer film in accordance with the invention is dimensionally stable and slightly flexible. Said multilayer film can readily be handled, transported and subjected to further treatments.

If the multilayer film comprises a plurality of screen printed levelling layers, a film of very uniform layer thickness is obtained.

In accordance with the invention, use is preferably made of a multilayer film in which the chemical composition of the ceramic components of the green ceramic substrate film and of the levelling layer(s) is the same. Such multilayer films can be calcinated and sintered without any problems.

Alternatively, it may be preferred that the chemical composition of at least one of the ceramic components of the levelling layer(s) differs from that of the substrate film.

The composition may for example be selected so that incompatibilities between the substrate ceramic and the material of the inner electrodes, for example different coefficients of thermal expansion or mutual diffusion and reaction or poor wetting properties are compensated for.

In that case, the multilayer film preferably comprises, between the green ceramic substrate film and the inner electrodes, a levelling layer which contains one or more ceramic components and a binder, and which is provided on the entire area of the multilayer film by means of screen painting.

A further preferred embodiment of the multilayer film in accordance with the invention is characterized in that the binder preparation of the green ceramic substrate film is hydrophilic and free of organic solvents. Apart from causing little or no pollution, such multilayer films also have excellent firing properties and hence can be fired extremely rapidly.

In the case of a multilayer film having a binder preparation of the green ceramic substrate film which is hydrophilic and free of organic solvents, the binder preparation of the inner electrodes and/or levelling layer(s) is preferably hydrophobic. By means of this measure it is precluded that the solvents of the binder preparation of the screen-printing pastes soften the substrate film and cause the screen-printing pattern to become stained.

Within the framework of the invention, the binder in the binder preparations preferably has a decomposition point >150° C. After the final drying treatment of the multilayer film, said binder preparations maintain their adhesive properties. This facilitates the accurate stacking of the films and improves the adhesion in the stack.

In accordance with another embodiment of the multilayer film, the binder preparation of the substrate film and/or of the inner electrodes and/or of the levelling layer(s) is thermoplastic. Since the binder preparations do not comprise solvents, such multilayer films cause little or no pollution. In addition, a uniform print is obtained because the viscosity of the paste does not change during screen printing. Screen-printing pastes comprising thermoplastic binder preparations have no drying time, so that several screen-printing processes can be rapidly carried out one after another. Multilayer films comprising thermoplastic binders can also readily be stored since they do not change at room temperature.

The inventive multicolour screen-printing method for the manufacture of multilayer films, in particular for passive electronic components having a multilayer structure, at least comprises the following steps:

the entire surface of a green ceramic substrate film comprising one or more ceramic components and a binder preparation is screen printed, optionally, with a ceramic screen-printing paste which contains one or more ceramic components and a binder preparation, at least one ceramic component of the ceramic screen printing paste differing from the components of the substrate film, an electrode pattern is provided by screen printing, using a metallizing paste which comprises one or more metallic components and, optionally, ceramic fillers and a binder preparation, the entire surface of the printed green ceramic substrate film is screen printed once or several times with a ceramic screen-printing paste which comprises one or more ceramic components and a binder preparation, optionally, at least one ceramic component of the ceramic screen printing paste differing from the components of the substrate film.

Since this method comprises a number of similar process steps, it can readily be automated.

A further aspect of the invention relates to the advantageous use of the inventive multilayer films for the manufacture of passive electronic components having a multilayer structure.

BRIEF DESCRIPTION OF THE DRAWINGS

The invention will be explained in greater detail with reference to the accompanying drawings, in which.

DETAILED DESCRIPTION OF THE PREFERRED EMBODIMENT

Figure 1:
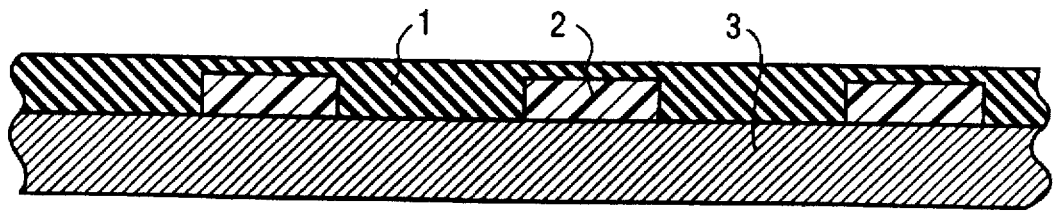
FIG. 1 is a cross-sectional view of an inventive multilayer film comprising a levelling layer.

FIG. 1 shows an embodiment of the inventive multilayer film, comprising a green ceramic substrate film (1) on which inner electrodes (2) are provided by screen printing and a levelling layer (1) which entirely covers the green ceramic substrate film (3) and the inner electrodes (2) and which is provided by screen printing.

Figure 2:
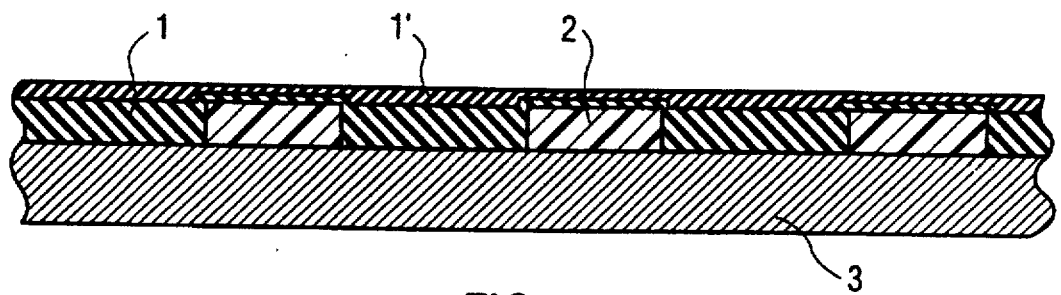
FIG. 2 is a cross-sectional view of an inventive multilayer film comprising two levelling layers.

FIG. 2 shows another embodiment of the inventive multilayer film comprising two levelling layers (1, 1a) which are provided by screen printing.

Figure 3:
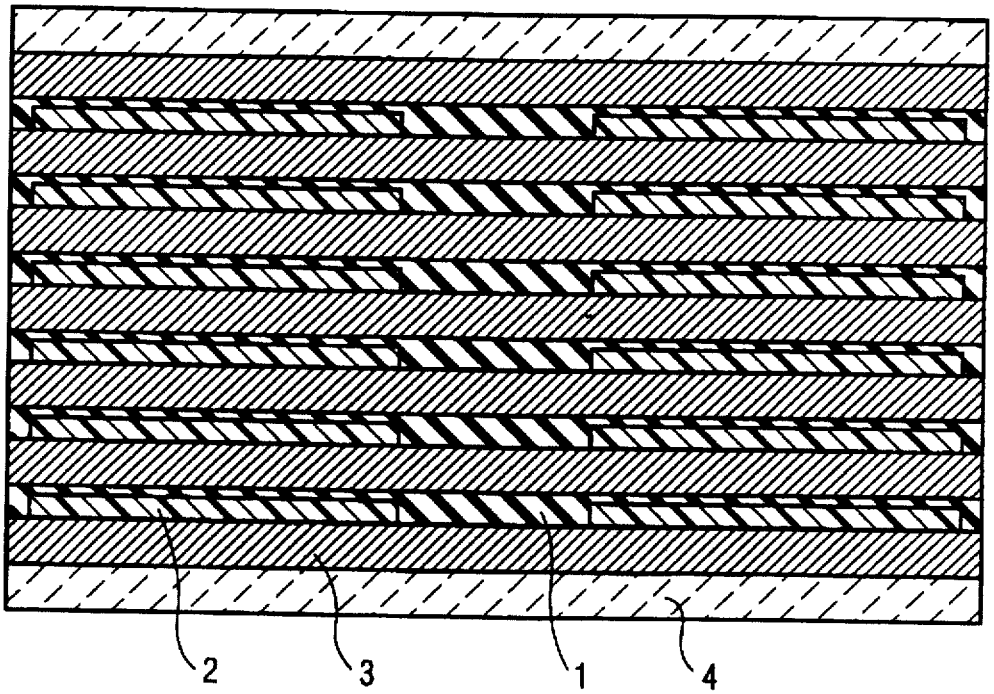
FIG. 3 is a cross-sectional view of a stack of films for a passive electronic component having a multilayer structure.
Figure 5:
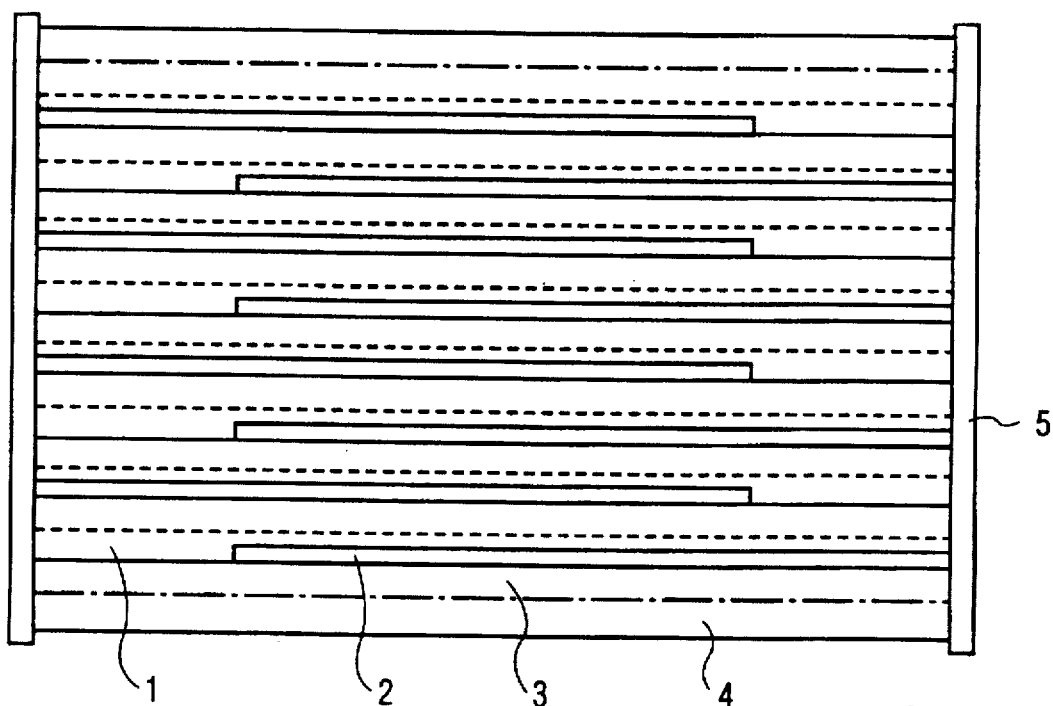
FIG. 5 is a diagrammatic cross-sectional view of a multilayer capacitor.

The manufacture of passive electronic components having a multilayer structure, for example a multilayer capacitor as shown in FIG. 5, by using the inventive multilayer films and the inventive multicolour screen-printing method usually comprises the following steps:

1. preparing the powder suspension for the ceramic substrate film (3),
2. preparing the slurry for the substrate film (3),
3. degasing the slurry in a vacuum,
4. sheeting, casting or extruding the substrate foil (3),
5. drying the green ceramic substrate foil (3),
6. optionally, screen printing the whole area of a levelling layer (1a),
7. screen printing the pattern of the inner electrodes (2),
8. screen printing the whole area of one or more levelling layers (1, 1a),
9. optionally, providing adhesives,
10. drying the multilayer film,
11. stacking the multilayer films including the unprinted substrate films (3) which are used as coating layers (4),
12. laminating the stack, as shown in FIG. 3, by means of a compression process,
13. separating the individual products,
14. burning out the binder,
15. sintering,
16. providing the outer contacts (5),
17. final inspection.

The selection of the raw material for the ceramic components of the green ceramic substrate film is governed by the field of application. For passive electronic components, use is predominantly made of oxide-ceramic components.

For multilayer capacitors, generally doped barium titanate is used as the oxide ceramic component. The ceramic material used for multilayer actuators is generally based on a modified lead titanate-lead zirconate phase, and the ceramic material for use in multilayer varistors is generally based on doped zinc oxide.

In addition to the ceramic main components which are governed by the field of application, the ceramic substrate film (3) customarily comprises further ceramic components which should improve the mechanical and/or electrical properties, for example grain growth inhibitors or sintering agents.

In a typical manufacturing process these starting materials are mixed, ground, calcinated and ground again to form a powder.

For the manufacture of the substrate films (3), the ceramic components must be mixed with a binder preparation to form a slurry. The choice of the binder also determines the production process of the film, and conversely.

Within the scope of the invention, use is preferably made of binder preparations which are hydrophilic and free of organic solvents. In this case, the slurry consists exclusively of an aqueous suspension comprising the ceramic powders which are coated with the plastic binder. Consequently, the slurry has a very low binder content. The slurry typically comprises for the solvent: distilled water,
for the binder: for example acrylic polymers, methyl cellulose or polyvinyl alcohol,
for the plasticizer: for example mixed phthalate ester or polyethylene glycol derivatives,
for the liquefier: for example methaphosphates or condensed arylsulfonic acids and
for the wetting agents: for example non-ionic octylphenoxy ethanol.

This slurry is subjected to further processing in a continuous moulding operation on a conveyor band. To this end, the slurry is poured onto a steel drum. The film thickness is limited either by process parameters, such as conveyor velocity, pouring velocity and viscosity of the slurry, or by a doctor blade. The film is passed through a drying tunnel.

After drying, the substrate films which have been manufactured by using hydrophilic binder preparations have a uniform microcrack structure. It has been found that for certain material combinations of substrate film (3), inner electrodes (2) and levelling layer (1), this has a favourable effect on the further manufacturing steps.

Within the scope of the invention, it may however also be preferable to manufacture films from substrate ceramic and thermoplastic binder preparations. Generally, thermoplastic materials belonging to the group of polypropylene, polyethylene or polystyrole are used. Sometimes thermoplastic materials having a higher melting point are combined with wax to preclude that the material becomes too soft and hence instable. Said films are extruded in the hot state from slot dies.

The ceramic green substrate films (3) can be manufactured by means of any known method, for example by continuous moulding, extruding or calendering. During the manufacture of the films they are customarily provided on supporting films so as to improve their handling. However, the multicolour screen-printing method in accordance with the invention does not require supporting films. Consequently, the removal of the supporting films prior to stacking can be dispensed with and the manufacturing accuracy during stacking is improved.

Subsequently, the green ceramic substrate films (3) are subjected to a screen-printing process in which they are provided with metallizing colorants for forming the inner electrodes (2) and with ceramic screen-printing colours to form the levelling layer (1) or the levelling layers (1, 1a).

For the metallizing colorant for the inner electrodes (2) use can be made of commercially available metallizing pastes. Said pastes generally comprise silver or silver alloys, such as silver palladium alloys, other palladium alloys, gold alloys, nickel or copper as the metallic components. It is alternatively possible, however, to use other metallic components comprising, for example, titanium, zirconium or molybdenum/manganese.

The metallizing colorant comprises, for example, 20 to 70% of metallic components and, if necessary, additives of ceramic components of the substrate film (3) and/or of the levelling layer (1) or of another ceramic powder. A medium quantity of resins, lacquers and other organic substances renders the colour paste suitable for printing.

Large differences between the coefficients of thermal expansion of the substrate ceramic and the metallic components can be compensated for by a quantity of substrate ceramic in the metallizing colorant.

The ceramic screen-printing colorants for the levelling layers (1, 1a) generally comprise the same ceramic components as the substrate film (3).

For the levelling layers (1, 1a), which are used to compensate for incompatibilities between the material of the inner electrodes (2) and the substrate foil (3), use can be made of, for example, silicates as additional ceramic components.

The binder preparation for the ceramic screen-printing colorants comprises, for example, a non-aqueous solvent such as butyl glycol, isopropanol or methyl isobutyl ketone, and cellulose derivatives such as ethyl cellulose or cellulose acetate butyrate or polyacrylate ester as the binder, and for the plasticizer use can for example be made of polyethylene glycol derivatives or mixed phthalate esters, and for the liquefier use can be made of fatty acids or aromatic sulphonic acids and, for example, polyethylene glycol derivatives can be used as the wetting agent.

A suitable combination of binders and solvents enables the formulation of the ceramic screen printing colorant to be varied so that it has levels of viscosity ranging between 25 and 800 centipoise, it dries rapidly or slowly and exhibits a more or less thixotropic behaviour. By accurately controlling these parameters, the levelling layers (1, 1a) are optimally screen printed.

The ceramic screen-printing colorants may alternatively comprise further components, for example fibre-reinforcing agents, so that a desired microcrack structure of the levelling layers (1, 1a) is preserved, while the flexibility and mechanical strength of the levelling layers (1, 1a) is improved.

The thermoplastic ceramic screen-printing colorants are based on binder preparations comprising a polyvinyl alcohol emulsion, acrylic resins, polyethylene and other thermoplastic materials.

The multicolour screen-printing operation can be carried out by means of the known screen-printing devices. Screen-printing operations have the advantage that semi-automatic and fully-automatic screen-printing machines are commercially available. Since in the method in accordance with the invention the positioning of the screen has been simplified, simple bench screen-printing devices as well as rotary screen printing machines can be used.

Figure 6:
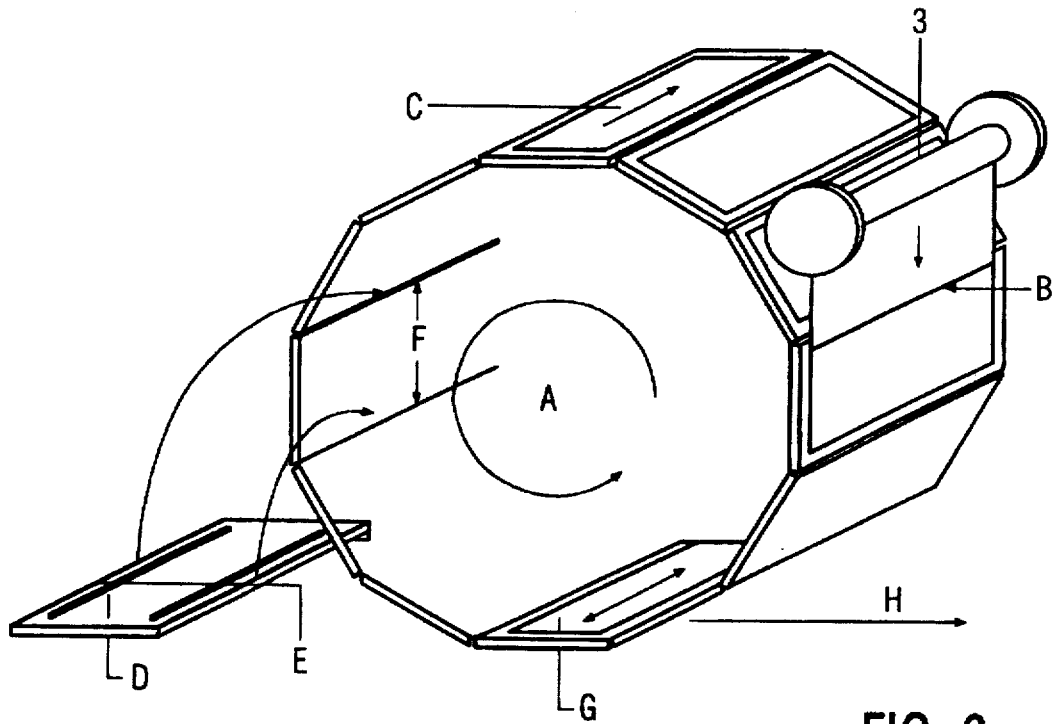
FIG. 6 is a flatbed screen-printing device for carrying out the inventive multicolour screen-printing process.

The invention will however be described by means of a screen-printing device as shown in FIG. 6, which is particularly suitable for the manufacture of passive electronic components having a multilayer structure.

The screens are made of a synthetic or, in particular for thermoplastic colorants, metallic fabric whose individual threads are very fine and arranged on top of each other so as to extend at right angles to each other.

First, the screen used for printing of the electrode pattern is provided. A photo-sensitive layer is provided on the screening fabric. The "montage", i.e. an exposed photo-sensitive film with a negative picture of the inner electrodes (2) is applied to said layer. Subsequently, the layer is exposed and developed. This results in a negative picture of the electrode pattern which is used as the stencil.

The screen for the levelling layers (1, 1a) remains without stencil.

These screens are arranged in the screen-printing position (C) in the screen-printing machine.

The green ceramic substrate film 3 is first unwound and, optionally, separated from the supporting film and cut with guillotine shears (B). The position of the substrate film (3) is left unchanged and the substrate film is held by a vacuum device which is accommodated in the printing drum (A).

The colorants which are ready for use in the printing process are provided on the screen in the direction of the width of the stencils and are spread by means of a squeegee. Subsequently, the colorant is pressed through the apertures in the fabric onto the underlying green, ceramic substrate film (3) by means of said squeegee (angular position 55° to 70°). The latter process must be carried out without interruption. In an efficacious embodiment, the direction of notion of the squeegee corresponds to the direction of the weft of the screening fabric and the longitudinal direction of the electrode pattern.

If thermoplastic screen-printing colorants (hot-melt colorants) are used in the screen-printing process, both the screen and the printing colorant must be preheated and maintained at a constant temperature. However, the use of said thermoplastic screen-printing colorants is very advantageous for a multicolour screen-printing method, since a plurality of colorants can be printed in direct succession and drying times can be disregarded. In addition, uniform printing results are obtained, since the viscosity of thermoplastic screen-printing colorants is not changed by the evaporation of solvents.

In accordance with the invention, first a levelling layer (1), the chemical composition of at least one of the ceramic components of which differs from the composition of the components of the substrate foil (3), can be printed onto said substrate foil.

Customarily, however, first the pattern of the inner electrodes (2) is first printed onto the green ceramic substrate film (3) with the metallizing colorant.

Subsequently, the screen or the printing position (C) is changed and a levelling layer (1) is printed onto the entire area of the substrate film (3) and inner electrodes (2).

If necessary, a second, very thin levelling layer (1') can be printed onto the first one.

The surface of the multilayer film may further be provided with an adhesive.

To this end, adhesive from an adhesive reservoir (D) is provided in the form of a line grating (F) on the multilayer film by means of the printing stamps (E).

The finished multilayer films are stacked in the position (G) and the stack is pre-compressed. Subsequently, the films are dried, laminated, notched and severed, whereafter they are transported to the kiln (H) where they are fired.

The firing and sintering process is customarily carried out in a chamber kiln or a sliding-bat kiln. It is important that the kiln is sufficiently aerated and exhausted so that the outgoing solvents and binders are either exhausted or completely burned.

In the embodiment in accordance with the invention, the small layer thickness of the multilayer film and the fine and uniform microcrack structure, which is obtained when, as preferred, aqueous binder preparations are used, facilitate the expulsion of the volatile constituents. Thus, no carbon residues remain in the multilayer film, which adversely affect the properties of the finished components or disturb said properties in the sintering process as a result of $CO_2$ formation.

EXEMPLARY EMBODIMENT

The ceramic substrate films (3) are manufactured by means of the continuous-moulding method.

Fine-grain powder of doped barium titanate and ammonium polyacrylate (degree of polarization 60) are dispersed in water.

A solution which comprises polyvinyl alcohol, triethylene glycol, wetting agents, release agents and water are added to this solution while stirring. After the slurry has been homogenized and degased, it is poured onto a rotating steel band. The spread-out layer is passed through a heated drying tunnel and removed from the steel band as a dried film (3). After the film (3) has been subjected to a post-heating treatment it is wound onto a drum. In this manner, very thin ceramic substrate films (3) can be manufactured which can be printed in the green form in the screen-printing process.

First, the metallizing paste is printed onto the entire area of the green ceramic substrate film (3) which is provided on a rotary screen-printing device as shown in FIG. 6, to form the inner electrodes (2). To this end, the substrate film (3) is cut to size by guillotine shears (B) and held on the drum (A) by a vacuum device; the screen carrying the printing pattern for the inner electrodes is provided and a thick layer of the metallizing paste is applied to the moulding screen. First, the metallizing paste is spread on the moulding screen by means of a squeegee. Subsequently, while exerting a uniform pressure, the squeegee is passed over the screen and the paste is pressed onto the substrate foil at the location of the apertures.

The screen is exchanged and the ceramic screen-printing paste is printed over the metallized substrate film (3, 2) by means of along with the screen for the levelling layers (1, 1a) is without a printing pattern and without a time-consuming positioning operation.

The green ceramic substrate film (3) typically has a thickness of 5–40 microns, the green inner electrodes (2) typically have a thickness of 5.5–8 microns and the levelling layer (1) typically has a height of from 1.5 to 3 microns, measured above the electrodes (2).

To facilitate the subsequent stacking and separating steps, an adhesive may additionally be provided on the finished green multilayer film. For the adhesive use can be made of a diluted ceramic screen-printing colorant.

Following the screen-printing process, multilayer films of equal or different printing patterns for the inner electrodes are stacked, as shown in FIG. 3, so that the proper construction of the passive electronic multilayer components to be manufactured is obtained. The upper and lower sides of the stack are provided with unprinted substrate films (3), so-called coating layers (4). Said coating layers (4) protect the active part of the finished passive electronic component.

The stack is initially stored at higher temperatures, for example 85° C. Subsequently, the stacks are laminated to form a semi-manufactured plate by exposing the stacks to thermocompression at 80° C., 300 MPa, for a few seconds.

Subsequently, the plate is divided into the individual products by notching and breaking, cutting or sawing.

First, the binder is burned out of these green products, and then the products are sintered.

Finally, the products are provided with external contacts which are provided by immersing the "active" sides, at which the inner electrodes are exposed, into a metallizing paste, followed by drying and sintering.

Figure 4A:
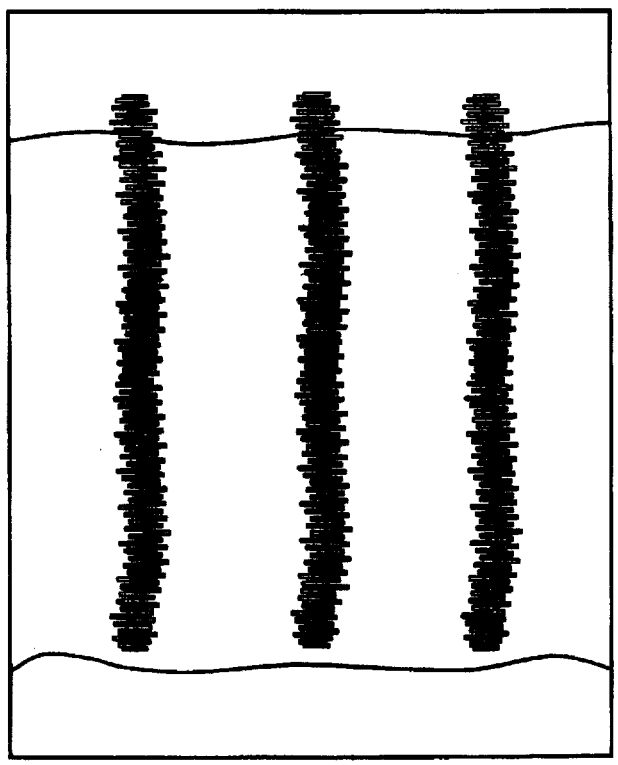
FIG. 4a is a micrograph of a passive electronic component having a multilayer structure, which is manufactured by using the multilayer films in accordance with the invention.
Figure 4B:
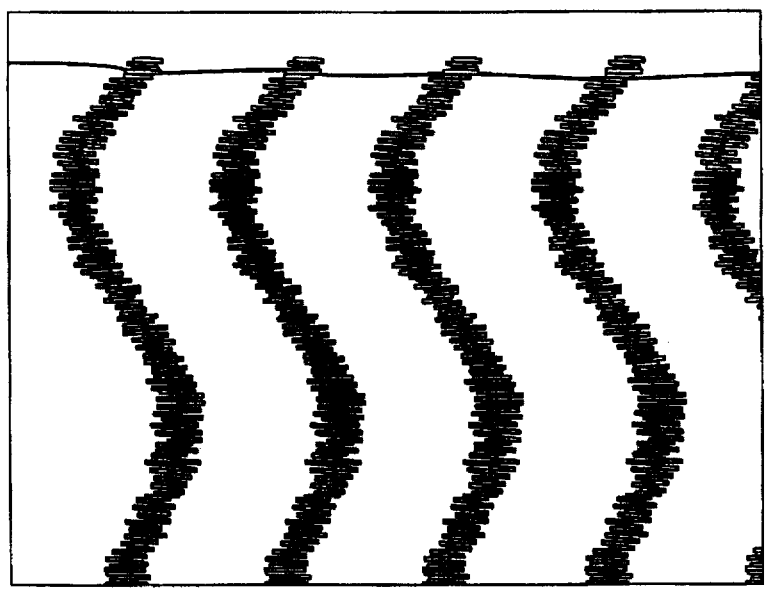
FIG. 4b is a micrograph of a passive electronic component having a multilayer structure in accordance with the present state of the art.

FIG. 4a is a micrographic representation of a multilayer capacitor which has been manufactured by means of the inventive multilayer films. FIG. 4b is a micrographic representation of a multilayer capacitor according to the state of the art. Said Figures show that by using the inventive multilayer films, "chevronning" can be precluded.

We claim:

1. A multilayer film having a multilayer structure, in particular for passive electronic components, said multilayer film comprising a multilayer structure, wherein each layer is of uniform thickness, of:

a) a green ceramic substrate film comprising at least one ceramic component and a first binder preparation for said at least one ceramic component, b) inner electrodes provided on a surface of said substrate film by screen printing, each of said electrodes comprising at least one metallic component and, optionally, both ceramic filling agents and a second binder preparation for said ceramic filing agents, and c) at least one leveling layer comprising one or more ceramic components and a third binder preparation for said at least one ceramic component provided by screen printing in a manner so as to completely cover said inner electrodes and evenly fill up the interstices between the inner electrodes to thereby completely cover said surface of said substrate film.

2. A multilayer film as claimed in claim 1, characterized in that the chemical composition of the ceramic components of the green ceramic substrate film and of the at least one leveling layer is the same.

3. A multilayer film as claimed in claim 1, characterized in that the chemical composition of at least one of the ceramic components of the at least one leveling layer differs from that of the green ceramic substrate film.

4. A multilayer film as claimed in claim 3, characterized in that said multilayer film comprises, between the green ceramic substrate film and the inner electrodes, an additional leveling layer which additional leveling layer comprises one or more ceramic components and a binder preparation, for said one or more components, and which substrate film is provided, by means of screen printing, on said surface of said substrate film in a manner so as to completely cover said surface.

5. A multilayer film as claimed in claim 1, characterized in that the binder preparation of the green ceramic substrate film for said at least one ceramic component is hydrophilic and free of organic solvents.

6. A multilayer film as claimed in claim 5, characterized in that the binder preparations other than the binder preparation of the green ceramic substrate film is hydrophobic.

7. A multilayer film as claimed in claim 1, characterized in that the binder in each binder preparation has a decomposition point ≧150° C.

8. A multilayer film as claimed in claim 1 characterized in that one of the binder preparations is thermoplastic.

* * * * *